US009910091B2

(12) United States Patent
Ho

(10) Patent No.: US 9,910,091 B2
(45) Date of Patent: Mar. 6, 2018

(54) METHOD FOR AUTO-CALIBRATING SEMICONDUCTOR COMPONENT TESTER

(71) Applicant: Heng-Chun Ho, Taipei (TW)

(72) Inventor: Heng-Chun Ho, Taipei (TW)

(*) Notice: Subject to any disclaimer, the term of this patent is extended or adjusted under 35 U.S.C. 154(b) by 73 days.

(21) Appl. No.: 15/018,198

(22) Filed: Feb. 8, 2016

(65) Prior Publication Data

US 2016/0238686 A1 Aug. 18, 2016

Related U.S. Application Data

(60) Provisional application No. 62/115,995, filed on Feb. 13, 2015.

(51) Int. Cl.
*G01R 31/00* (2006.01)
*G01R 31/319* (2006.01)

(52) U.S. Cl.
CPC .......... *G01R 31/3191* (2013.01); *G01R 31/00* (2013.01)

(58) Field of Classification Search
CPC ........ G01R 31/3191; G01R 31/318511; G01R 31/3187; G01R 31/31937; G01R 35/005; G01R 31/2834; G01R 31/31926; G01R 31/31901; G01R 31/2829; G01R 31/2851; G01R 31/3167; G01R 31/31707; G01R 31/3172; G06F 1/3234; G06F 17/5031; G06F 17/5081; G06F 1/10; G06F 11/263
See application file for complete search history.

(56) References Cited

U.S. PATENT DOCUMENTS

| | | | | |
|---|---|---|---|---|
| 5,256,964 A * | 10/1993 | Ahmed | .............. | G01R 31/3191 324/73.1 |
| 6,570,397 B2 * | 5/2003 | Mayder | ................ | G01R 31/319 324/750.02 |
| 6,622,103 B1 * | 9/2003 | Miller | ............ | G01R 31/318385 702/89 |
| 7,043,959 B2 * | 5/2006 | Ibane | ................. | G01R 31/3191 324/750.02 |
| 7,106,081 B2 * | 9/2006 | Mayder | ................ | G01R 35/005 324/750.02 |
| 2002/0199141 A1 * | 12/2002 | Lemlein | ........... | G01R 31/31937 714/724 |

* cited by examiner

*Primary Examiner* — Vinh Nguyen
(74) *Attorney, Agent, or Firm* — Muncy, Geissler, Olds & Lowe, P.C.

(57) ABSTRACT

A method for auto-calibrating a semiconductor component tester is provided. The semiconductor component tester includes a wafer tester or a package IC tester. Firstly, an initial tester setting value and an initial board setting value are acquired through a calibration board. Then, the test record of the semiconductor component corresponding to each test time and the tester parameter and the board parameter for testing the semiconductor component are recoded. If the semiconductor component fails the test, the semiconductor component is tested again according to the previously-passed tester parameter and the previously-passed board parameter, or the semiconductor component is tested again after the tester parameter and the board parameter are adjusted. The method is capable of correcting the improper test result from the improper tester parameter.

7 Claims, 8 Drawing Sheets

XXXXXXXXX  Authority : Hardware engineer

Tester number : 01

Test record

| Test time | Test record name | Type | | | |
|---|---|---|---|---|---|
| 2015-06-29 | L_507.txt | 0 | View | Load | Delete |
| 2015-06-30 | L_508.txt | 0 | View | Load | Delete |
| 2015-07-01 | L_509.txt | 0 | View | Load | Delete |
| 2015-07-02 | L_510.txt | 0 | View | Load | Delete |
| 2015-07-03 | L_511.txt | 0 | View | Load | Delete |
| 2015-07-03 | L_511.txt | 0 | View | Load | Delete |

FIG.7

Compensating value calibration

Board parameters — 420

| value 1 B201 | value 2 B202 | value 3 B203 | value 4 B204 |
|---|---|---|---|
| value 5 B205 | value 6 B206 | value 7 B207 | value 8 B208 |
| value 9 B209 | value 10 B210 | value 11 B211 | value 12 B212 |
| value 13 B213 | value 14 B214 | value 15 B215 | value 16 B216 |

Tester parameters — 120

| value 1 A201 | value 2 A202 | value 3 A203 | value 4 A204 |
|---|---|---|---|
| value 5 A205 | value 6 A206 | value 7 A207 | value 8 A208 |
| value 9 A209 | value 10 A210 | value 11 A211 | value 12 A212 |
| value 13 A213 | value 14 A214 | value 15 A215 | value 16 A216 |

Compensating value setting — 530

| 1 | 0.1 | 0.01 | 0.001 |
|---|---|---|---|
| +3 Delta | +2 Delta | +1 Delta | 0 |
| | | -1 Delta | -2 Delta | -3 Delta |

OK    Cancel

FIG.9 ized. The above objects and advantages of the present invention will become more readily apparent to those ordinarily skilled in the art after reviewing the following detailed description and accompanying drawings, in which:

METHOD FOR AUTO-CALIBRATING SEMICONDUCTOR COMPONENT TESTER

CROSS-REFERENCE TO RELATED APPLICATION

This application claims the benefit of U.S. Provisional Patent Application No. 62/115,995, filed Feb. 13, 2015, entitled "The method for analyzing and auto-calibrating wafer and IC package unit test equipment", the contents of which are incorporated herein by reference.

FIELD OF THE INVENTION

The present invention relates to a semiconductor component tester, and more particularly to a method for auto-calibrating a semiconductor component tester according to a test record.

BACKGROUND OF THE INVENTION

The manufacturing process in the semiconductor industry is divided into several stages, including a chip (IC) design stage, a wafer fabrication stage (Wafer Fab), a wafer probing stage and a wafer packaging stage. In the wafer probing stage, a probe is used to test all dies of the wafer. That is, a probe formed of a metal pin is installed on a test head, and the probe is contacted with a pad on the die to test the electrical properties of the die. Moreover, the dies were not able to pass/meet test criteria, then the test are printed with ink marks. After the wafer with plural individual dies is tested, the dies with the marks are discarded, and the subsequent process is not performed. Meanwhile, the wafer probing stage is completed.

Generally, the wafer tester uses a channel board to test the wafer. According to the type of the wafer to be tested, a corresponding channel board is used. Moreover, the wafer tester has one or plural insertion slots for inserting one or plural channel boards therein. Conventionally, the channel board has 32 channels, 64 channels, 128 channels, or more than 128 channels . . . , etc.

Moreover, according to the type of the wafer, the wafer tester and the channel board provide corresponding test parameters to the dies of the wafer to judge whether the dies of the wafer are normally operated. Conventionally, after the test parameters of the wafer tester are set by the original factory/supplier, the test parameters of the wafer tester are provided from the original factory/supplier. However, because of improper tester installation, parts replacement, part aging or other causes, the test parameters set by the original factory/supplier cannot be continuously used to test the wafer. Under this circumstance, the wafer perhaps fails the test.

For solving the above drawbacks, it is necessary to notify the maintenance engineer of the original factory to re-calibrate the tester and set the suitable test parameters. However, since the testing procedure has to be interrupted during the re-calibrating process, the testing efficiency is largely reduced. Moreover, even if the tester has been calibrated, the test parameters are possibly unsatisfied because the conventional technology doses not provide the calibrating comparison function about the test parameters of the channel board. That is, after the tested is calibrated, an improper test result is possibly generated because the test parameters of the channel board cannot be calibrated.

SUMMARY OF THE INVENTION

The present invention provides a method for auto-calibrating a semiconductor component tester in order to increase the efficiency of testing semiconductor components, especially the efficiency of testing wafers or IC package units.

In accordance with an aspect of the present invention, there is provided a method for auto-calibrating a semiconductor component tester. The tester is used for testing at least one semiconductor component with at least one DUT (Device Under Test). The tester includes at least one board slot for receiving a channel board therein. Each channel board includes at least one test channel. The method includes the following steps. In a step (A), a calibration board in the board slot is detected to acquire an initial tester setting value of the tester and an initial board setting value of the channel board, and the initial tester setting value of the tester and the initial board setting value of the channel board are recorded. In a step (B), the semiconductor component is tested to acquire a test record of the tested semiconductor component, a test timing/frequency of the tested semiconductor component and a tester parameter of the tester and a board parameter of the channel board for the tested semiconductor component. If the semiconductor component fails the test the semiconductor component is tested again according to the tester parameter and the board parameter corresponding to the previously-passed semiconductor component.

In an embodiment, if the semiconductor component fails the test according to the tester parameter and the board parameter corresponding to the previously-passed semiconductor component, the method further includes the following steps. In a step (C), a compensating value is automatically generated according to a difference between the initial tester setting value and the tester parameter corresponding to the not-passed semiconductor component and a difference between the initial board setting value and the board parameter corresponding to the not-passed semiconductor component. In a step (D), a calibrated tester parameter and a calibrated board parameter are generated according to the compensating value, and testing the not-passed semiconductor component according to the calibrated tester parameter and/or the calibrated board parameter.

In an embodiment, the steps (A), (B), (C) and (D) are performed by executing a system program. The system program further provides a user interface, and at least one compensating value modification block is shown on the user interface. When the compensating value modification block is selected, the system program automatically generates the calibrated tester parameter and/or the calibrated board parameter.

In an embodiment, the test record is stored in a cloud storage device.

In an embodiment, the channel board is a device power supplies board or a high speed digital board.

In an embodiment, the semiconductor component tester includes a wafer tester or a package IC tester.

In an embodiment, the semiconductor component to be tested includes at least one wafer, at least one die or at least one Package IC unit.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 7 schematically illustrates an example of the test record;

FIG. 9 schematically illustrates a compensating value calibration interface according to an embodiment of the present invention.

DETAILED DESCRIPTION OF THE PREFERRED EMBODIMENT

The present invention will now be described more specifically with reference to the following embodiments and accompanying drawings.

First of all, the test items of semiconductor components will be described as follows. The semiconductor component tester comprises a wafer tester or a package IC tester. The semiconductor component to be tested comprises a wafer or a package IC unit. In the following embodiment, the technical features of the present invention will be illustrated by taking the wafer tester as an example of the semiconductor component tester. It is noted that the semiconductor component tester is not restricted to the wafer tester. Similarly, the concepts of the present invention may be used to test at least one die or at least one package IC unit.

As mentioned above, a wafer usually comprises one or plural device under test (DUTs) such as dies. Each device under test comprises one or plural precision measurement units (PMUs). The precision measurement unit further comprises a phasor measurement unit, an electric power measurement unit and a pulse measurement unit. The phasor measurement unit, the electric power measurement unit and the pulse measurement unit have different levels, which are reference values of the circuits of the precision measurement unit. The tester provides an input signal (e.g., power/voltage) and the channel board provides one or plural channels (e.g., comparators) in order to test the reference value of each Device Under Test (DUT). Then, the reference value of the test result is fed back to the tester, and the tested reference value is recorded in a test record. The quality of the device under test is judged according to the obtained reference value. Moreover, the tester and the channel board have tester parameters and board parameters for testing the device under test. The tester parameters and board parameters are input signals (e.g., power/voltage signals) for providing the test levels. The technologies about the test levels of the wafer are well known to those skilled in the semiconductor industry, and are not redundantly described herein.

Figure 1:
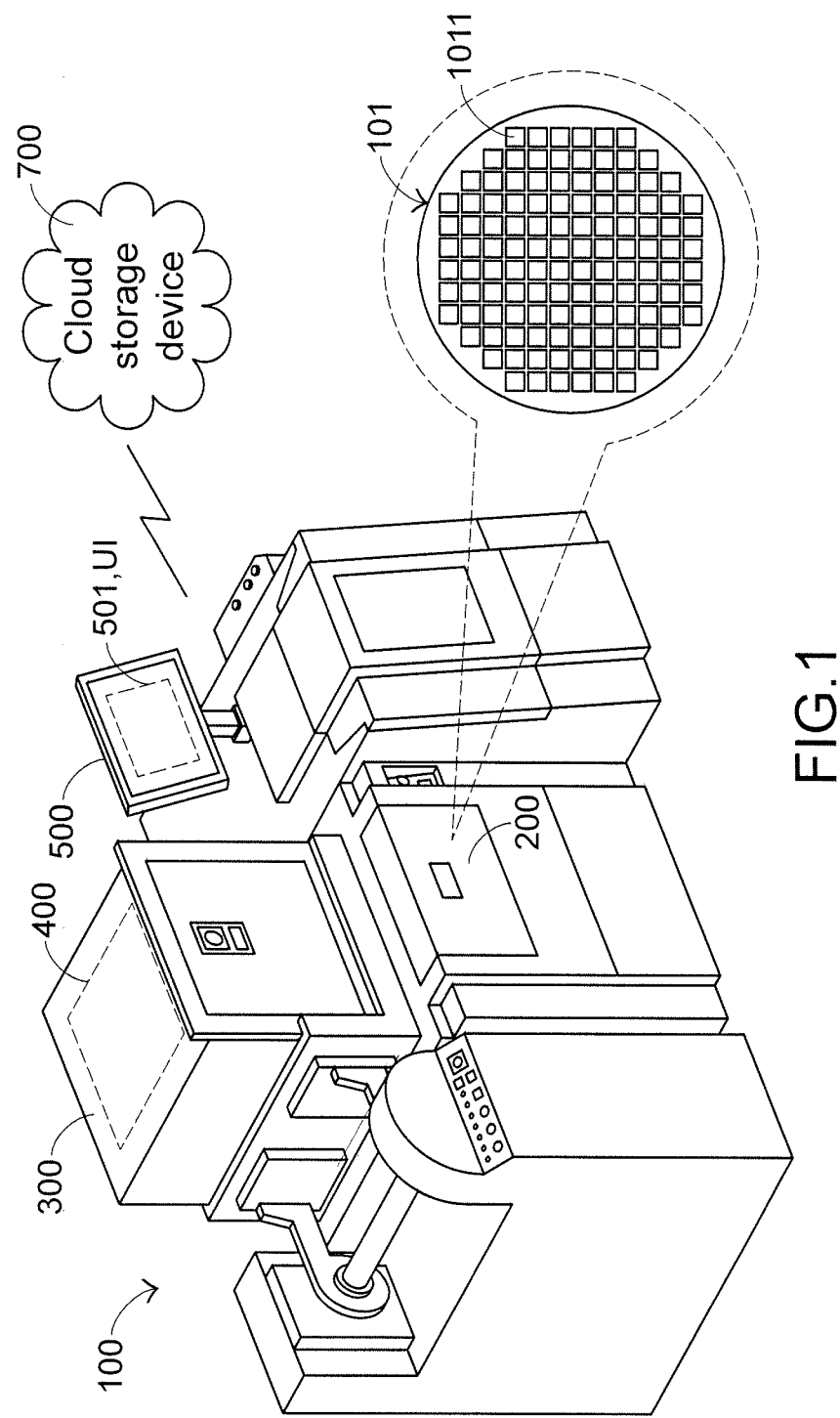
FIG. 1 schematically illustrates a semiconductor component tester using the method of the present invention.
Figure 2:
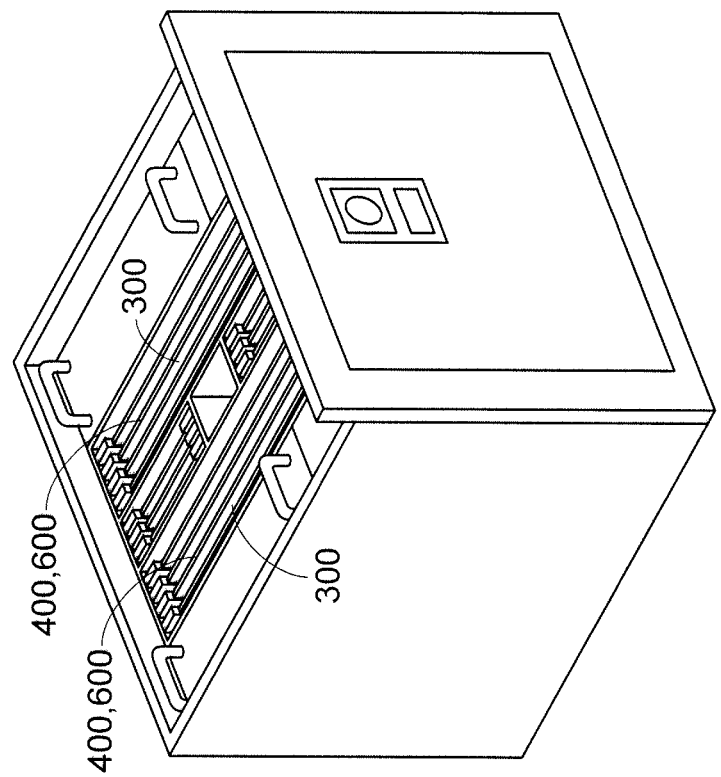
FIG. 2 schematically illustrates the board slots of the semiconductor component tester of FIG. 1.

Please refer to FIGS. 1 and 2. FIG. 1 schematically illustrates a semiconductor component tester using the method of the present invention. FIG. 2 schematically illustrates the board slots of the semiconductor component tester of FIG. 1.

As shown in FIGS. 1 and 2, the wafer tester 100 comprises a wafer probing machine 200, board slots 300, channel boards 400 and calibration boards 600. The wafer tester 100 is connected with an electronic device 500 (e.g., a desktop computer) and a cloud storage device 700. The wafer probing machine 200 is used for testing wafers 101. Each wafer 101 comprises plural device under test (DUTs) 1011 such as dies. The board slots 300 are used for receiving one or plural channel boards 400. Each channel board 400 comprises one or plural test channels. The number of channels of the channel board 400 is determined according to the properties of the wafer. For example, the channel board 400 has 32 channels, 64 channels, 128 channels, or more than 128 channels. The calibration boards 600 are used for acquiring initial tester setting values 110 of the wafer tester 100 (see FIG. 5) and initial board setting values 410 of the channel boards 400 (See FIG. 6). The computer 500 has a built-in system program 501 for executing the method of testing the wafers 101. Moreover, the system program 501 of the computer 500 further provides a user interface UI for displaying various parameters of the method of the present invention to be operated by the user. After the wafer 101 is tested by the wafer tester 100, a test record 510 is stored in the cloud storage device 700.

The operations of the calibration board 600 will be illustrated as follows. Firstly, the calibration board 600 is electrically connected with the channel board 400 by a maintenance engineer, and then the calibration board 600 and the channel board 400 are inserted into the corresponding board slot 300. The calibration board 600 comprises a reference test circuit (not shown). Then, the system program 501 of the computer 500 is executed, and the reference test circuit of the calibration board 600 is used to test the wafer 101. Consequently, the initial tester setting values 110 and the initial board setting values 410 are acquired. Then, the system program 501 stores the initial tester setting values 110 and the initial board setting values 410 into the test record 510. The ways of executing the system program to acquire the initial setting values are well known to those skilled in the semiconductor industry, and are not redundantly described herein.

Figure 3:
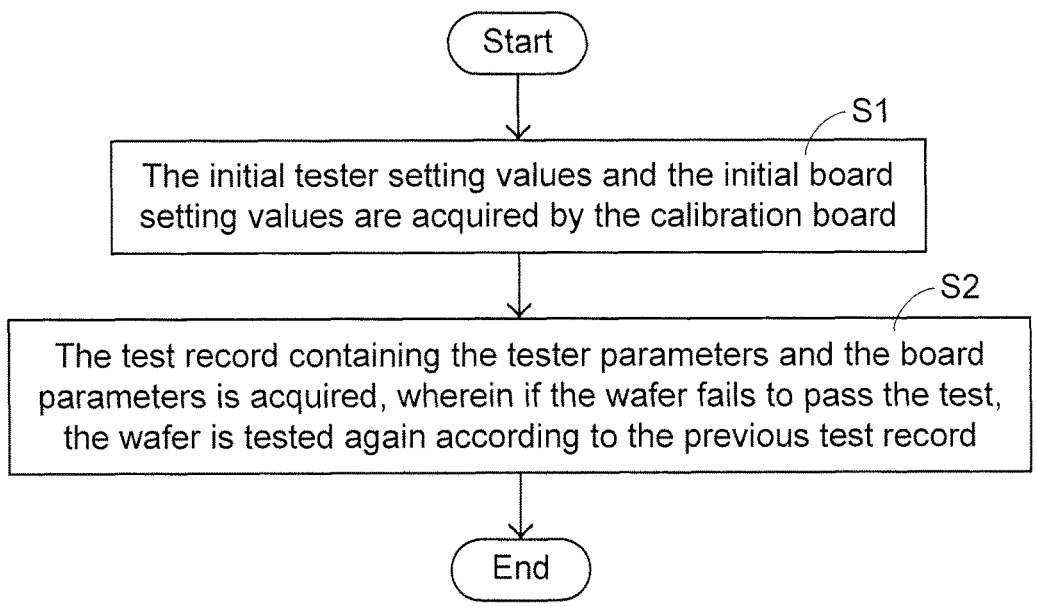
FIG. 3 is a flowchart illustrating a method for auto-calibrating a wafer tester according to an embodiment of the present invention.

FIG. 3 is a flowchart illustrating a method for auto-calibrating a wafer tester according to an embodiment of the present invention. The method for auto-calibrating the wafer tester 100 at least comprises the following steps. In a step S1, the initial tester setting values 110 and the initial board setting values 410 are acquired by the calibration board 600. In a step S2, the wafers are successively tested by the wafer tester 100, and the test record 510 about the information of the tested wafers at a test time is generated. The test record 510 contains tester parameters 120 (see FIG. 8) and board parameters 420 (see FIG. 8). If the wafer fails the test, the wafer tester 100 is re-calibrated according to the previously-passed tester parameters 120 and the previously-passed board parameters 420, and then the wafer testing procedure is repeatedly done. After the wafer testing procedure is completed, the test record 510 of this wafer testing procedure is stored in the cloud storage device 700. The test time is in a unit of every day, every week or every test cycle. The tester parameters 120 and the board parameters 420 are recorded in each test record 510 of the tested wafer 101 on the basis of the test time.

An implementation example of calibrating the wafer tester 100 according to the previous test record 510 will be illustrated as follows. In the step S1, the test record 510 of the wafer tester 100 contains the initial tester setting values 110 and the initial board setting values 410 corresponding to different types and different numbers of channel boards 400 and the tester parameters 120 and the board parameters 420 corresponding to each test time. For example, the type of the channel board includes a device power supplies (DPS) board or a high speed digital (HSD) board. Preferably but not exclusively, the types of the channel boards of the tester are different. If the wafer 101 fails the test of the wafer tester 101, the system program 501 reads the test record 510 corresponding to each test time of the channel board 400 according to the type and number of the channel board 400 for this test. Moreover, the system program 501 tests the wafer again according to the previously-passed tester parameters 120 and the previously-passed board parameters 420 in the test record 510. In particular, if the wafer 101 fails the test of the wafer tester 101, the channels that fail to pass the test will be considered in the new testing procedure by the system program 501. That is, the system program 501 tests the wafer 101 again according to the parameters of the board parameters 420 corresponding to the above channels.

Figure 5:
FIG. 5 schematically illustrate examples of the initial tester setting values shown on the user interface.
Figure 6:
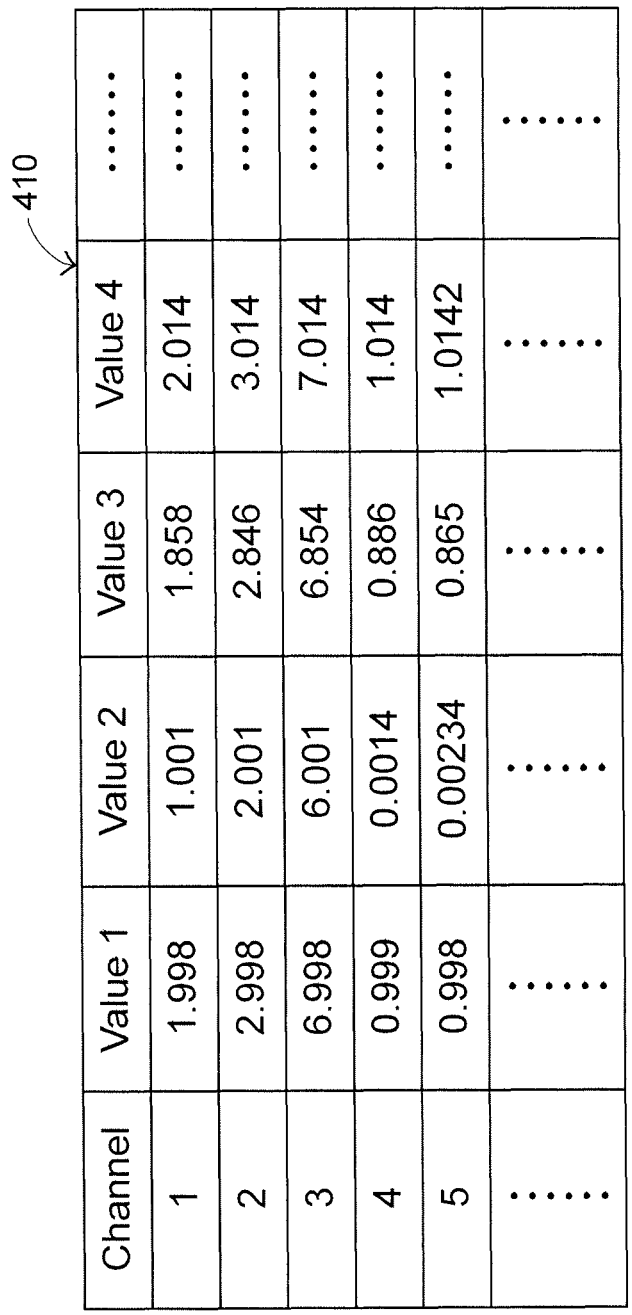
FIG. 6 schematically illustrate examples of the initial board setting values shown on the user interface.

The ways of showing the initial tester setting values 110 and the initial board setting values 410 on the user interface UI by the system program 501 will be illustrated with reference to FIGS. 5 and 6. As shown in FIG. 5, the initial tester setting values 110 are stored as a text file and shown on the computer 500 (see FIG. 5). As shown in FIG. 6, the initial board setting values 410 contain the initial setting values of all channels of the channel board, which are indicated as a table. It is noted that the ways of showing the initial tester setting values 110 and the initial board setting values 410 are not restricted. According to the practical requirements, the ways of showing these setting values on the user interface by the system program 501 may be adjusted.

Figure 8:
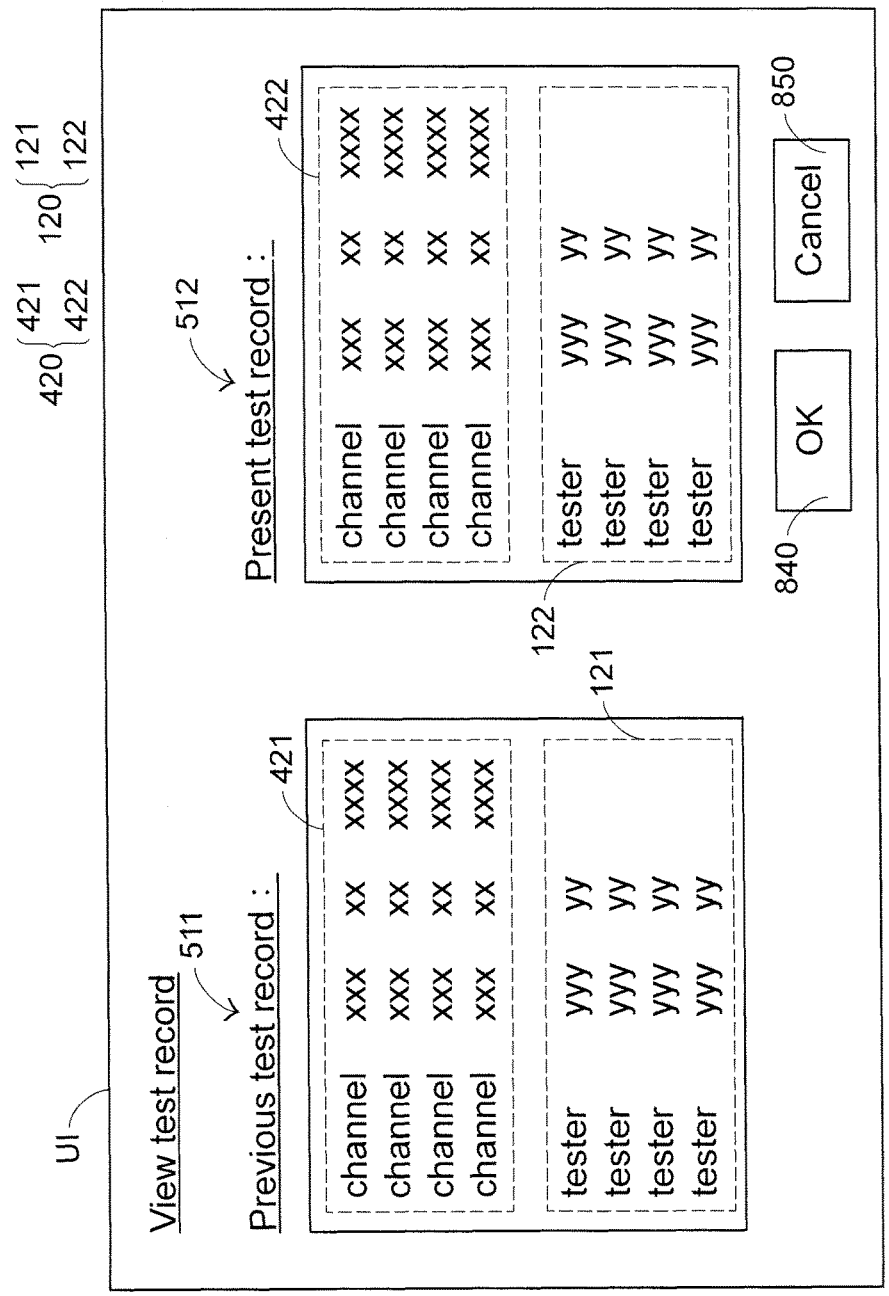
FIG. 8 schematically illustrates examples of the tester parameters and the board parameters.

Please refer to FIGS. 7 and 8. FIG. 7 schematically illustrates the test record 510 of the wafer 101 shown on the computer 500. FIG. 8 schematically illustrates the tester parameters 120~422 and the board parameters 420~422 shown on the computer 500. In FIG. 7, a table 800 is shown on the user interface UI by the system program 501, and the test record 510 is recorded in the table 800. The table 800 at least contains a test time field 810, a test record name field 820 and a view block 830. The test time of the wafer 101 is written into the test time field 810. The test record name corresponding to the test time is written into the test record name field 820. The view block 830 links to another user interface for viewing the contents of the corresponding test record 510. The test record 510 contains the tester parameters 120~122 and the board parameters 420~422 corresponding to the test time. For example, the test record 510 is obtained at a specified time segment of every day or obtained every day. In FIG. 8, the operating interface containing a test record 512 and the previously-passed test record 511 is shown. If the wafer fails the test and the view block 830 corresponding to the test record 512 is selected (see FIG. 7), the display picture of the user interface UI contains the present test record 512, the previous test record 511, a confirmation block (OK) 840 and a cancel block 850. Then, the system program 501 compare whether the tester parameters 121 and the board parameters 421 of the previously-passed test record 511 are identical to the tester parameters 122 and the board parameters 422 of the test record 512, respectively. If the tester parameters 121 and 122 are not identical or the board parameters 421 and 433 are not identical, after the confirmation block 840 is selected, the system program 501 tests the wafer again according to the test record 511. Whereas, if the wafer fails the test of the wafer tester 100 according to the previous test record 511 or if the tester parameters 121 and the board parameters 421 of the previously-passed test record 511 are respectively identical to the tester parameters 122 and the board parameters 422 of the test record 512, the following procedure will be performed.

Figure 4:
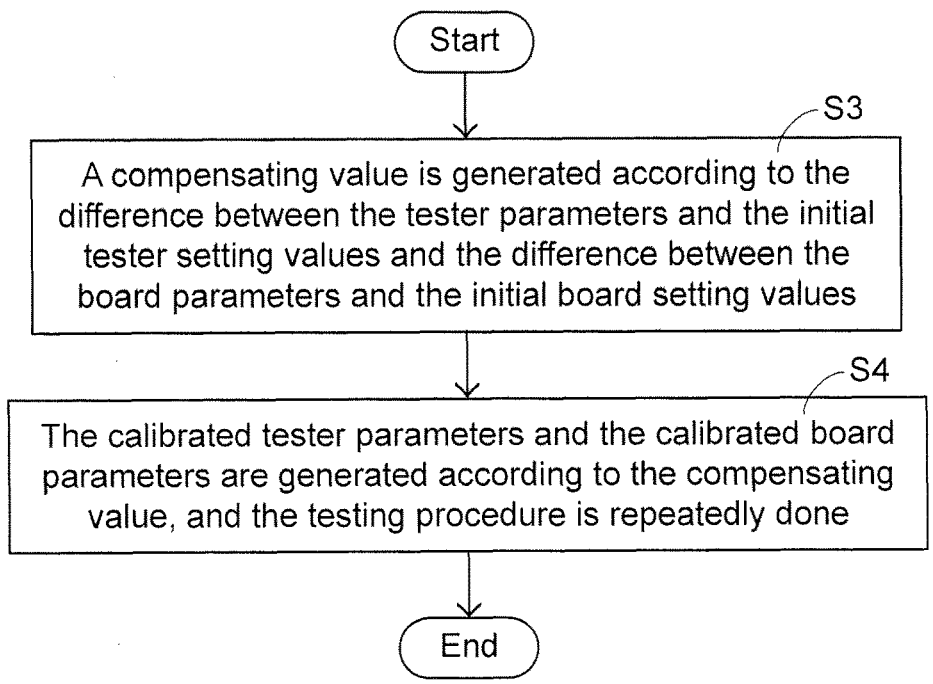
FIG. 4 is a flowchart illustrating a method for auto-calibrating a wafer tester according to another embodiment of the present invention.

The method of the present invention can be further modified. FIG. 4 is a flowchart illustrating a method for auto-calibrating a wafer tester according to another embodiment of the present invention. The method for auto-calibrating the wafer tester 100 further comprises the following steps. In a step S3, a compensating value 520 is generated according to the difference between the tester parameters 120 and the initial tester setting values 110 and the difference between the board parameters 420 and the initial board setting values 410. In a step S4, the calibrated tester parameters 130 and the calibrated board parameters 430 are generated according to the compensating value 520. In this embodiment, the system program 501 generates the compensating value 520 according to the difference between the tester parameters 120 and the initial tester setting values 110 and the difference between the board parameters 420 and the initial board setting values 410, and thus generates one or both of the calibrated tester parameters 130 and the calibrated board parameters 430. The tester parameters 120 and the board parameters 420 are current values, voltage values or other values that are provided by the wafer tester 100 and the channel board 400. Moreover, the tester parameters 120 and the board parameters 420 are used for testing the electric properties of the wafer 101 while the wafer 101 is tested by the wafer tester 100. The test record 510 contains the tester parameters 120 and the board parameters 420 corresponding to each test time.

FIG. 9 schematically illustrates a compensating value calibration interface according to an embodiment of the present invention. The method of the above embodiment will be illustrated with reference to FIGS. 4 and 9. In FIG. 9, a compensating value calibration interface is shown on the user interface UI. The user interface UI contains one or plural tester parameters 120, one or plural board parameters 420 and one ore plural compensating value modification blocks 530. The one or plural tester parameters 120 and the one or plural board parameters 420 are the test record of the wafer that fails the test. If any compensating value modification block 530 is selected, the system program 501 generates the calibrated tester parameters 130 or the calibrated board parameters 430 according to a default calibration value corresponding to the selected compensating value modification block 530. After calculation, the calibration value is a new value that has been calibrated at a specified proportion (e.g., +/−3%). Then, the system program 501 performs the wafer testing procedure according to the calibrated tester parameters 130 and/or the calibrated board parameters 430.

More especially, if the wafer 101 fails the test of the wafer tester 100, the user can further judges whether the wafer tester 100 or the channel board 400 is the major cause of the not-passed test. Consequently, the present test result about the wafer 101 that fails the test of the wafer tester 100 is stored in the test record 510 and then uploaded to the cloud storage device 700. Then, the channel board 400 is transferred to another wafer tester, and the not-passed test record 510 is downloaded to this wafer tester. After the same wafer 101 is tested by this wafer tester according to the test record 510, the user can judge whether the cause of the not-passed test is the wafer tester 100 or the channel board 400. The technologies of judging the cause of the not-passed test are well known to those skilled in the semiconductor industry, and are not redundantly described herein.

From the above descriptions, the present invention provides a method for auto-calibrating a semiconductor component tester. In accordance with the method of the present invention, the test record is generated on the basis of the test time, and the wafer is tested again according to the previously-passed test record. Consequently, the wafer tester and the channel board are automatically calibrated. Moreover, a calibrated tester parameter and a calibrated board parameter are generated according to a compensating value, and the tester parameter and the board parameter are compensated according to the calibrated tester parameter and the calibrated board parameter. Consequently, the overall calibrating time is largely reduced. Moreover, the value to be calibrated can be compensated according to the method of the present invention. For example, the tester parameter and/or the calibrated board parameter can be compensated. The method of the present invention can facilitate the user to manage the wafer tester and allow the user to calibrate the wafer tester in a time-saving manner.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for auto-calibrating a semiconductor component tester, the tester being used for testing at least one semiconductor component with at least one device under test, the tester comprising at least one board slot for receiving a channel board therein, each channel board comprising at least one test channel, the method comprising steps of:
    (A) detecting a calibration board in the board slot by a computer to acquire an initial tester setting value of the tester and an initial board setting value of the channel board, and recording the initial tester setting value of the tester and the initial board setting value of the channel board; and
    (B) testing the semiconductor component by the computer to acquire a test record of the tested semiconductor component, a test timing/frequency of the tested semiconductor component and a tester parameter of the tester and a board parameter of the channel board for the tested semiconductor component, wherein if the semiconductor component fails the test, the semiconductor component is tested again according to the tester parameter and the board parameter corresponding to a previously-passed semiconductor component.

2. The method according to claim 1, wherein if the semiconductor component fails the test according to the tester parameter and the board parameter corresponding to the previously-passed semiconductor component and becomes a not-passed semiconductor component, the method further comprises steps of:
    (C) automatically generating a compensating value according to a difference between the initial tester setting value and the tester parameter corresponding to the not-passed semiconductor component and a difference between the initial board setting value and the board parameter corresponding to the not-passed semiconductor component; and
    (D) generating a calibrated tester parameter and a calibrated board parameter according to the compensating value, and testing the not-passed semiconductor component according to the calibrated tester parameter and/or the calibrated board parameter.

3. The method according to claim 2, wherein the steps (A), (B), (C) and (D) are performed by executing a system program, wherein the system program further provides a user interface, and at least one compensating value modification block is shown on the user interface, wherein when the compensating value modification block is selected, the system program automatically generates the calibrated tester parameter and/or the calibrated board parameter.

4. The method according to claim 1, wherein the test record is stored in a cloud storage device.

5. The method according to claim 1, wherein the channel board is a device power supplies board or a high speed digital board.

6. The method according to claim 1, wherein the semiconductor component tester includes a wafer tester or a package IC tester.

7. The method according to claim 1, wherein the semiconductor component to be tested includes at least one wafer, at least one die or at least one Package IC unit.

* * * * *